(12) United States Patent
Lee (10) Patent No.: US 6,228,700 B1
(45) Date of Patent: May 8, 2001

(54) METHOD FOR MANUFACTURING DYNAMIC RANDOM ACCESS MEMORY

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/389,824

(22) Filed: Sep. 3, 1999

(51) Int. Cl.$^7$ ............................... H01L 21/8242
(52) U.S. Cl. ............................... 438/238; 438/253
(58) Field of Search ............................ 438/238–240, 438/250–256, 381, 390–399

(56) References Cited

U.S. PATENT DOCUMENTS

| | | | |
|---|---|---|---|
| 6,130,102 | * 10/2000 | White, Jr. et al. | 438/253 |
| 6,143,602 | * 11/2000 | Jang | 438/253 |

* cited by examiner

Primary Examiner—Jey Tsai (74) Attorney, Agent, or Firm—Thomas, Kayden, Horstemeyer & Risley (57) ABSTRACT

A method for manufacturing dynamic random access (DRAM) memory. A substrate has a plurality of active regions marked out by shallow trench isolation (STI) structures therein. A conductive layer and a barrier layer are formed over the substrate. The conductive layer and the barrier layer are patterned to form bit line contact openings and node contact openings so that a portion of the active region and the shallow trenches are exposed. In the meantime, a word line inside the active region is also patterned out. Source/drain terminals are formed in the active regions. A bit line plug is formed inside each bit line contact opening, and a landing pad is formed inside each node contact opening. An oxide layer is formed over the bit line plugs and the landing pads. A word line patterning operation is conducted to establish the word line structures. A first dielectric layer is formed over the substrate, and then a bit line structure that connects with the bit line plug is formed in the first dielectric layer. A second dielectric layer is formed over the first dielectric layer, and finally a capacitor that connects electrically with a landing pad is formed above the second dielectric layer.

19 Claims, 6 Drawing Sheets

METHOD FOR MANUFACTURING DYNAMIC RANDOM ACCESS MEMORY

BACKGROUND OF THE INVENTION

1. Field of the Invention

The present invention relates to a method for manufacturing dynamic random access memory (DRAM). More particularly, the present invention relates to a method for manufacturing a capacitor over bit line (COB) type of DRAM.

2. Description of the Related Art

DRAM is an important electronic component in the data communications industry. Advances in semiconductor processing techniques have yielded high-capacity DRAMs that occupy only a very small volume. Currently, the capacitor over bit line (COB) type of DRAM is widely adopted.

Figure 1A:
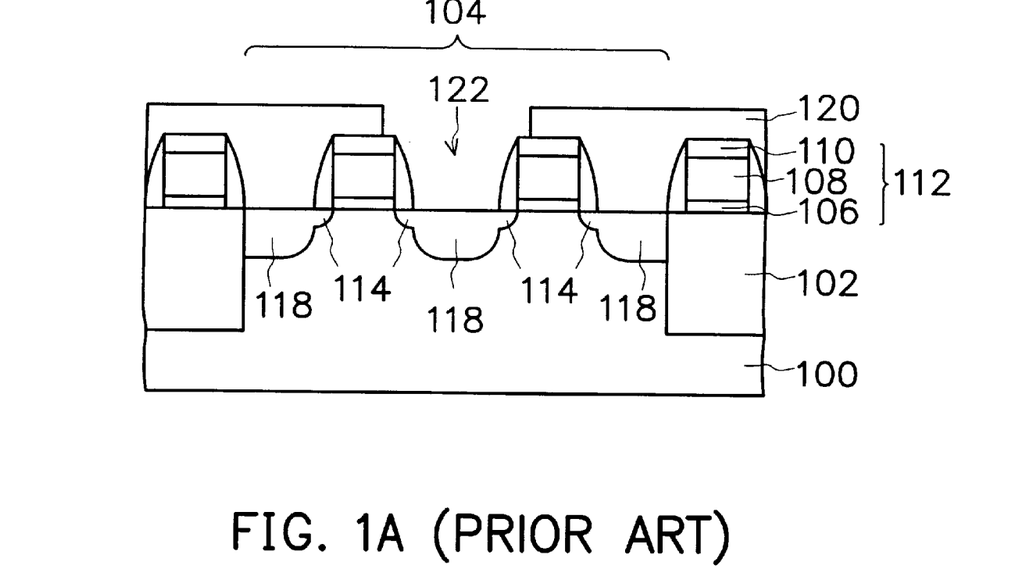
FIGS. 1A and 1B are schematic views showing steps for producing a conventional COB type of DRAM.
Figure 1B:
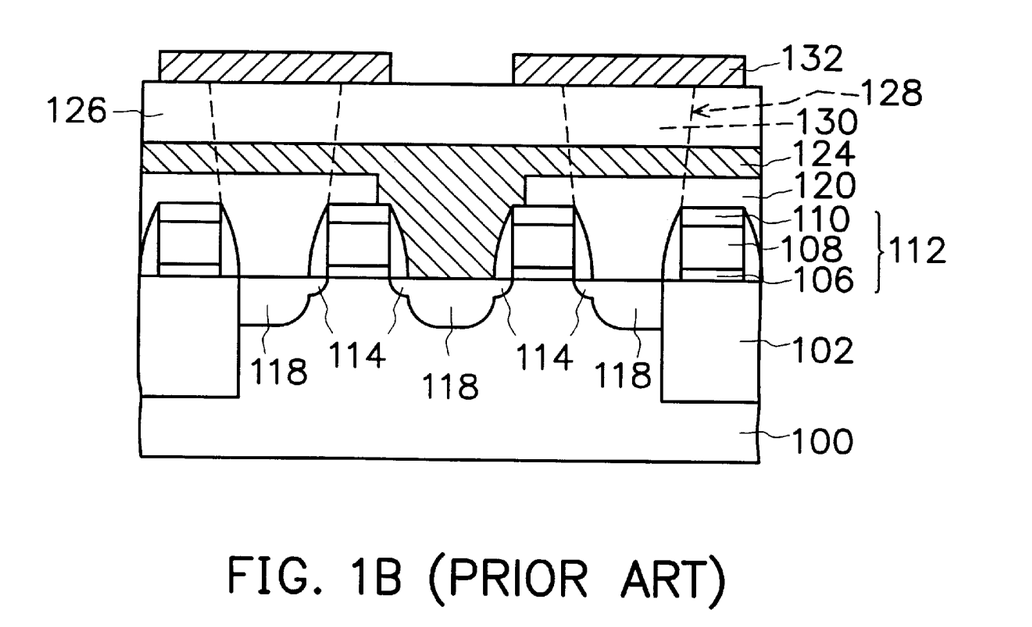

FIGS. 1A and 1B are schematic views showing the steps in producing a conventional COB type of DRAM.

As shown in FIG. 1A, a substrate 100 is provided. Shallow trench isolation (STI) structures 102 are formed in the substrate 100 so that an active region 104 is marked out. A word line structure 112 is formed by depositing a gate oxide layer 106, a gate electrode 108 and a cap layer 110 in sequence. Substrate regions having a lightly doped drain structures 114 are formed on each side of the word line structure 112. Spacers 116 are formed on the sidewalls of the word line structure 112. Source/drain terminals 118 are formed in the substrate 100. Dielectric material is deposited over the substrate 100 to form a first dielectric layer 120. A portion of the first dielectric layer 120 is removed to form a bit line contact opening 122 that exposes a source terminal 118.

As shown in FIG. 1B, a bit line structure 124 is formed over the first dielectric layer 120. The bit line structure 124 is electrically connected to the source terminal 118 via the bit line contact 122. Dielectric material is again deposited over the substrate 100 to form a second dielectric layer 126. A node contact opening 128 that passes through the second dielectric layer 126 and the first dielectric layer 120 and exposes the drain terminal 118 is formed. A node contact 130 is formed inside the node contact opening 128 so that the drain terminal is electrically linked. A capacitor structure 132 is formed above the second dielectric layer 126. The capacitor structure 132 is electrically connected to the drain terminal via the node contact 130. Since the node contact 130 and the bit line structure 124 are formed in different cross-sectional planes, dashed lines are used to outline the positions of the node contact opening 128 and the node contact 130 in FIG. 1B.

In the aforementioned method of forming COB type capacitor, the bit line contact opening in the first dielectric layer may be slightly misaligned. Therefore, a tighter design rule is often adopted for the bit line contact in order to prevent poor electrical connection or failure of the bit line contact to connect with the source terminal.

In addition, the first and the second dielectric layer have to be etched when the node electrode opening is formed. Because a thick layer of dielectric material needs to be removed, the etching process is harder. Furthermore, the aspect ratio of the node contact opening is relatively large. Hence, forming a node contact inside the node contact opening is a difficult process. Moreover, some voids are likely to form within the node contact, leading to a considerable increase in resistance between the node contact and the drain terminal.

SUMMARY OF THE INVENTION

Accordingly, one object of the present invention is to provide a method for manufacturing DRAM having fewer difficult processing steps and more relaxed design rules.

A second object of this invention is to provide a method for manufacturing a COB type of DRAM such that the aspect ratio of a node contact opening needed to accommodate a node contact that leads to a capacitor is effectively reduced. Hence, quality of the node contact is improved.

To achieve these and other advantages and in accordance with the purpose of the invention, as embodied and broadly described herein, the invention provides a method for manufacturing DRAM. Shallow trench isolation (STI) structures are formed in a substrate marking out active regions, wherein width and length of the active region is controlled by the STI structures. A gate oxide layer, a conductive layer and a barrier layer are sequentially formed over the substrate. Using photolithographic and etching techniques, a portion of the conductive layer and the barrier layer are removed to form bit line contact openings and node contact openings. The bit line contact openings and the node contact openings expose a portion of the gate oxide layer in the active region and a portion of the gate oxide layer above the STI structure. The operation also marks out an area above the active region for accommodating a word line. However, neighboring word line structures are still joined together by a portion of the conductive layer and barrier layer. A lightly doped drain structure is formed in the substrate exposed by the bit line contact openings and the node contact openings. Spacers are formed on the sidewalls of the bit line contact openings and the node contact openings. The exposed gate oxide layer at the bottom of the bit line contact openings and the node contact openings are removed so that a portion of the substrate is exposed. Source terminals are formed in the substrate regions exposed by the bit line contact openings while drain terminals are formed in the substrate regions exposed by the node contact openings.

In the subsequent step, a bit line plug is formed in each bit line contact opening while a landing pad is formed in each node contact opening. Since each bit line contact opening and each node contact opening cover a portion of the active region and a portion at the top of the STI structure, area at the top of the bit line plug is larger than the source terminal while area at the top of the landing pad is larger than the drain terminal. An oxide layer is formed over the bit line plug and the landing pad. Using photolithographic and etching techniques, word line patterning is carried out to remove the conductive layer and barrier layer between neighboring word lines. Because a portion of the barrier layer and conductive layer has to be removed in the word line patterning operation, a high etching selectivity of oxide relative to the material forming the barrier layer and the conductive layer makes the oxide layer above the bit line plug and the landing pad an effective protection against possible damages due to etching. A first dielectric layer is formed over the substrate. First contact openings are formed in the first dielectric layer to expose the bit line plugs. Since the first dielectric layer is made from an oxide material, a portion of the oxide layer is removed when the first contact opening is formed. A bit line structure is formed over the first dielectric layer. The bit line structure is electrically connected to the bit line plug via the first contact.

A second dielectric layer is formed over the substrate. A second contact opening that passes through the second dielectric layer and the first dielectric layer is formed. A second node contact is formed inside the second contact opening, and then a capacitor is formed over the second dielectric layer. The capacitor is electrically connected to the second node contact, while the second node contact is electrically connected to the landing pad.

In a second embodiment of this invention, a landing pad contact opening that exposes the landing pad contact is formed in the first dielectric layer together with the first contact opening that exposes a portion of the bit line plug. When the bit line structure is formed over the first dielectric layer, a second landing pad is formed inside the landing pad contact opening. In the subsequent step, a second dielectric layer is formed over the substrate, and then a second contact opening that exposes the second landing pad is formed in the second dielectric layer. A second node contact is formed inside the second contact opening. Finally, a capacitor is formed over the second dielectric layer.

Since the word line structure within the active region as well as the bit line contact opening and the node contact opening are formed in the same patterning step, multiple photolithographic and etching operations can be avoided. Hence, misalignment is minimized and processing precision is increased.

In addition, the bit line contact opening encloses a larger area than the source terminal in the active region while the node contact opening encloses a larger area than the drain terminal in the active region. Consequently, area at the top surface of the bit line plug is larger than the source terminal while area at the top of the landing pad is larger than the drain terminal. Thus, it is easier to align the first contact opening and the second contact opening with respect to the bit line plug and the landing pad. Furthermore, the bit line plug and the landing pad are fabricated before the bit line structure and the node contact that leads to a capacitor are formed. Hence, aspect ratios of the first contact openings and the second contact openings are greatly reduced, and quality of the bit line structures and the node contacts are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
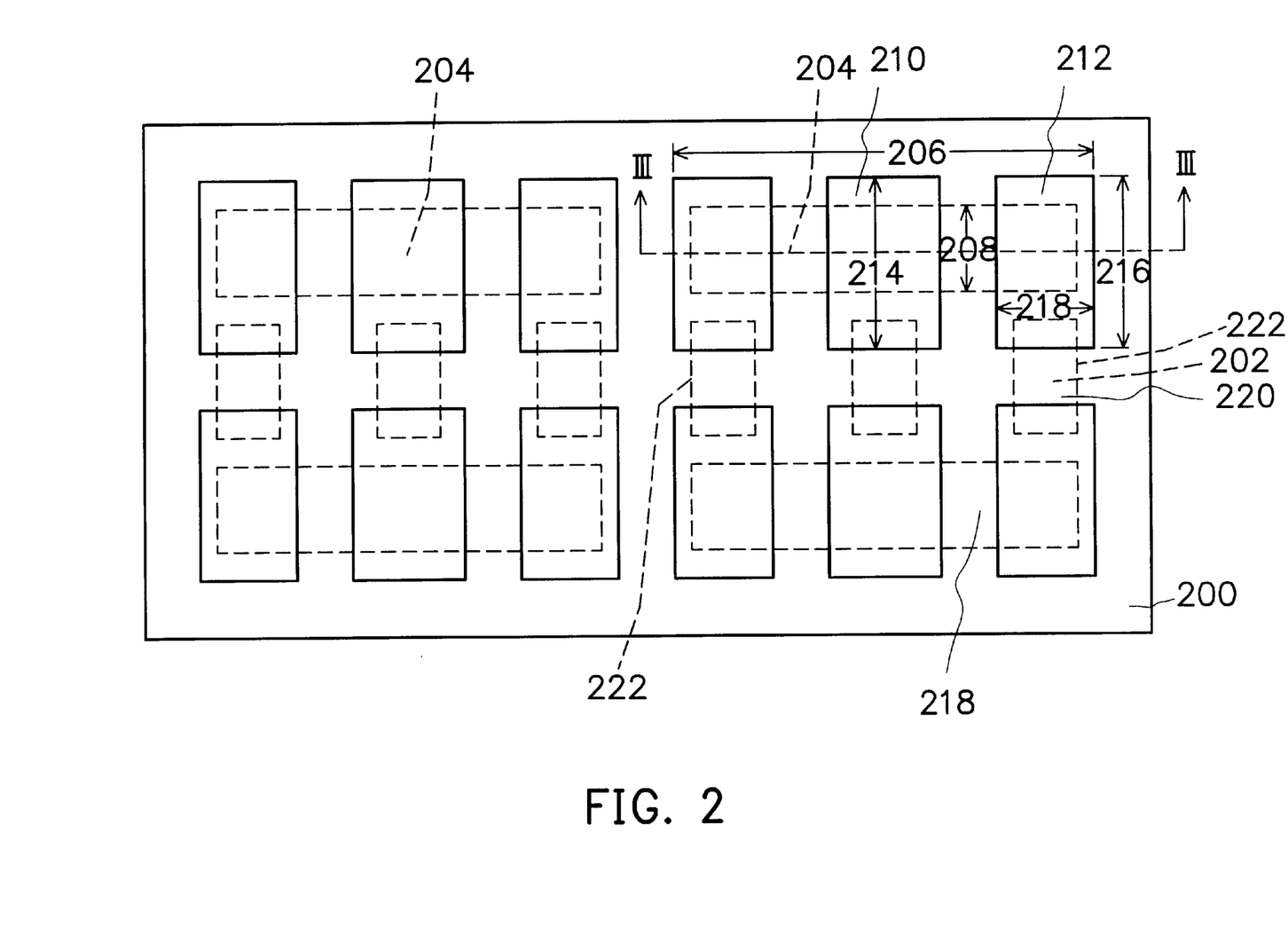
FIG. 2 is a schematic top view of a part of the DRAM structure fabricated according to a first preferred embodiment of this invention.

FIG. 2 is a schematic top view of a part of the DRAM structure fabricated according to a first preferred embodiment of this invention. As shown in FIG. 2, a substrate 200 having shallow trench isolation (STI) structures 202 thereon is provided. The STI structures 202 mark out an active region 204 such that the width 206 and the length 208 of the active region 204 are determined by the positioning of the STI structures 202. A gate oxide layer 300 (shown in FIG. 3A), a conductive layer 302 (shown in FIG. 3A) and a barrier layer 304 (shown in FIG. 3A) are formed over the entire substrate 200. Using photolithographic and etching techniques, a portion of the conductive layer 302 and the barrier layer 304 are removed to form bit line contact openings 210 and node contact openings 212. The conductive layer 302 can be a polysilicon layer, and the barrier layer 304 can be a nitride layer, for example. The length 214 of each bit line contact opening 210 is longer than the length 208 of the active region 204. Hence, the bit line contact opening 206 does not include a portion of the active region, but covers a portion of the STI structure 202. Similarly, the length 216 of the node contact opening 212 is also longer than the length 208 of the active region 204, but the width 218 covers a portion of the STI structure 202. When the bit line contact openings 206 and the node contact openings 212 are formed, a portion of the word line structure 218 is also patterned. However, a portion of the conductive layer 302 and the barrier layer 304 are still in the junction area 220 between neighboring word line structures 218. To prevent electrical connection between neighboring word line structures 218, the conductive layer 302 and the barrier layer 304 inside designated region 222 are removed in a subsequent word line patterning operation.

FIGS. 3A through 3F are cross-sectional views along line III—III of FIG. 2 showing the progression of steps for producing a DRAM structure according to the first preferred embodiment of this invention.

Figure 3A:
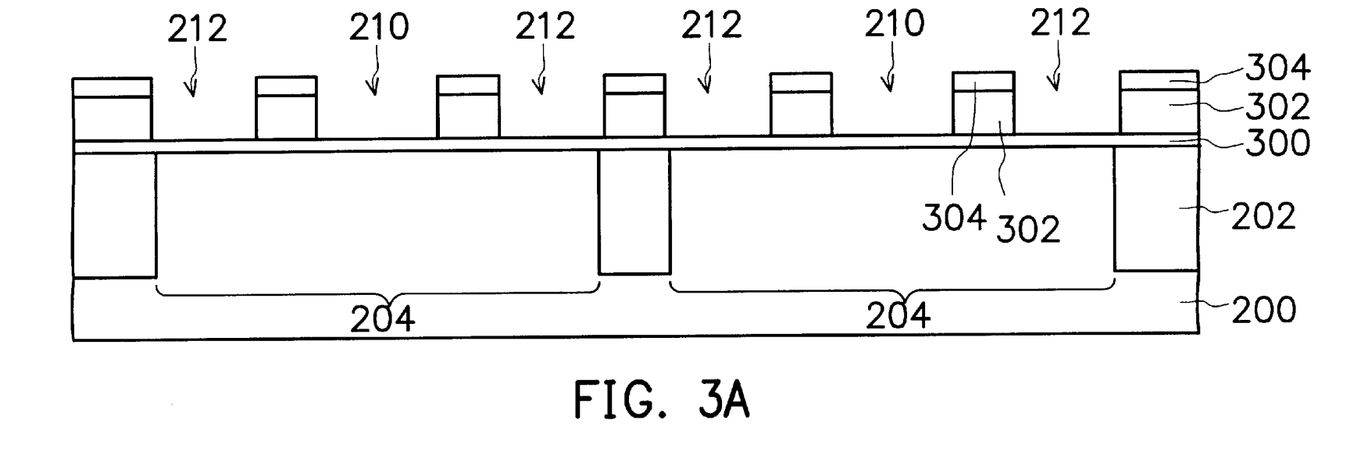
FIGS. 3A through 3F are cross-sectional views along line III—III of FIG. 2 showing the progression of steps for producing a DRAM structure according to the first preferred embodiment of this invention.

As shown in FIG. 3A, the STI structures 202 are formed in a substrate 200 so that the active region 204 is patterned out. The gate oxide layer 300, the conductive layer 302 and the barrier layers are sequentially formed over the substrate 200. A portion of the conductive layer and the barrier layer 304 are removed to form the bit line contact openings 210 and the node contact openings 212. A portion of the word line structure 218 is also patterned out thereafter.

Figure 3B:
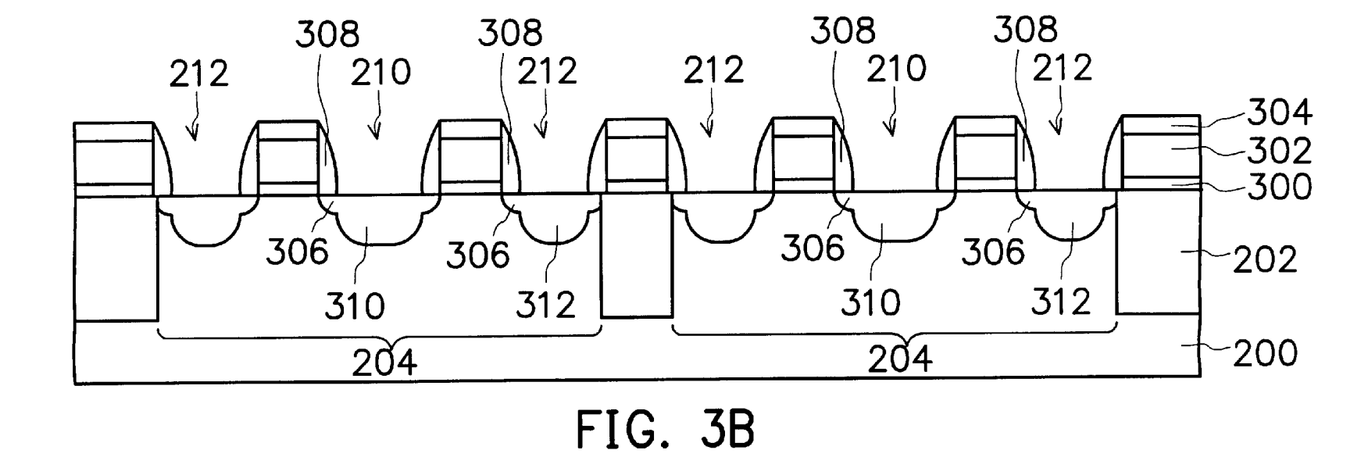

As shown in FIG. 3B, lightly doped drain structures 306 are formed in the substrate 200 at the bottom of the bit line contact openings 210 and the node contact openings 212 inside the active region 204. Spacers 308 are next formed on the sidewalls of the bit line contact openings 210 and the node contact openings 212. The spacers 308 can be formed by, for example, forming an oxide layer (not shown) conformal to the substrate profile followed by an etching back operation. During the etching back step, a portion of the gate oxide layer 300 is also removed. Consequently, areas at the bottom of the bit line contact openings 210 and the node contact openings 212 not covered by the spacers 308 are exposed. Source terminals 310 are formed in the substrate at the bottom of the bit line contact openings 210, whereas drain terminals 312 are formed in the substrate at the bottom of the node contact openings 212. The source terminals 310 and the drain terminals 312 are formed by, for example, ion implantation.

Figure 3C:
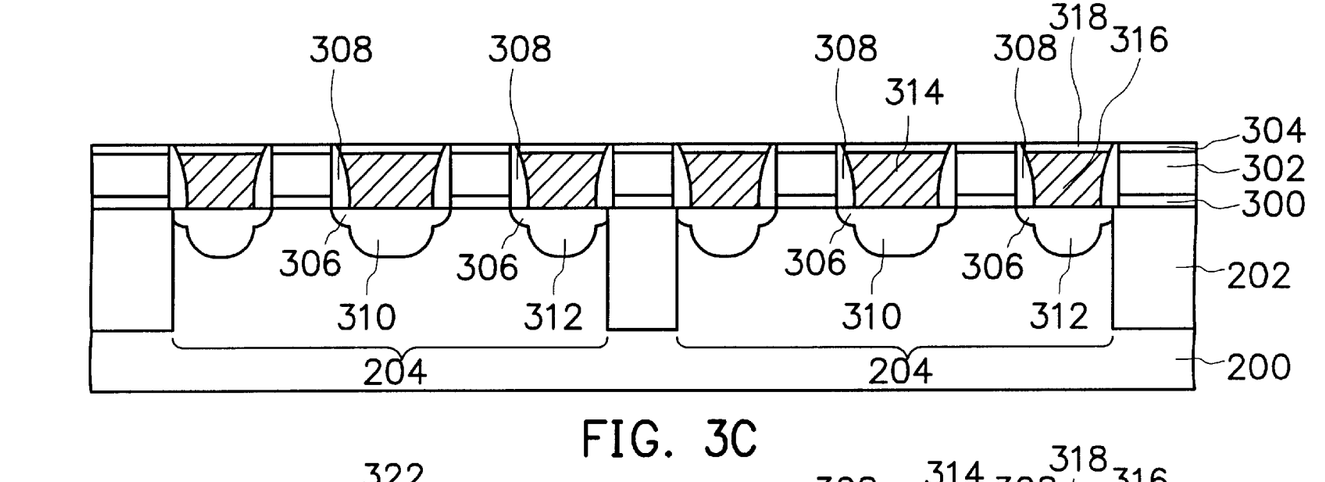

As shown in FIG. 3C, bit line plugs 314 are formed inside the bit line contact openings 210 while landing pads 316 are formed inside the node contact openings 212. The bit line plugs 314 and the landing pads 316 can be formed by, for example, depositing a polysilicon layer over the substrate 200 so that the bit line contact openings 210 and the node contact openings 212 are filled, and removing a portion of the polysilicon layer by chemical-mechanical polishing so that the polished polysilicon layer and the barrier layer 304 have identical heights. In the subsequent step, oxide layers 318 are formed over the bit line plugs 314 and the landing pads 316 by oxidation.

Figure 3D:
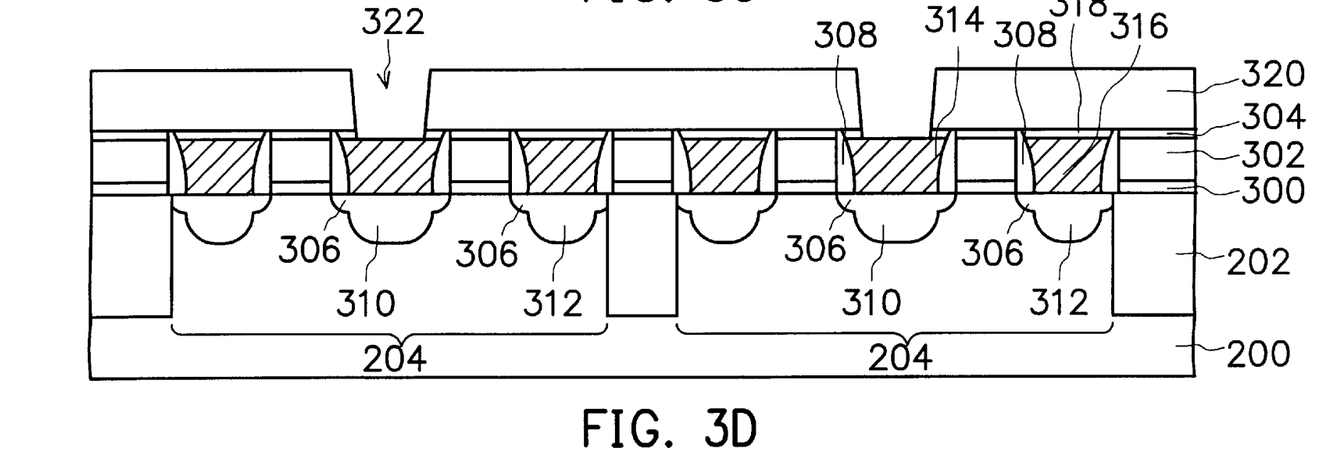

As shown in FIGS. 2 and 3D, word line patterning is carried out using photolithographic and etching techniques to remove the barrier layer 304 and the conductive layer at the junction area 220. Hence, word line structures 218 are formed and neighboring word line structures 218 are separated. During the word line patterning process, the oxide layer 318 is able to protect the bit line plugs 314 and the landing pads 316 against etching. This is because an etchant having a larger etching rate for nitride and polysilicon than oxide can be chosen. A dielectric layer 320 is formed over the entire substrate 200. First contact openings 322 are formed in the dielectric layer 320 such that a portion of the bit line plugs 314 are exposed. The first dielectric layer can be an oxide layer, and the first contact openings 322 can be formed using photolithographic and etching techniques to removed a portion of the first dielectric layer 320 and the oxide layer 318, for example.

Figure 3E:
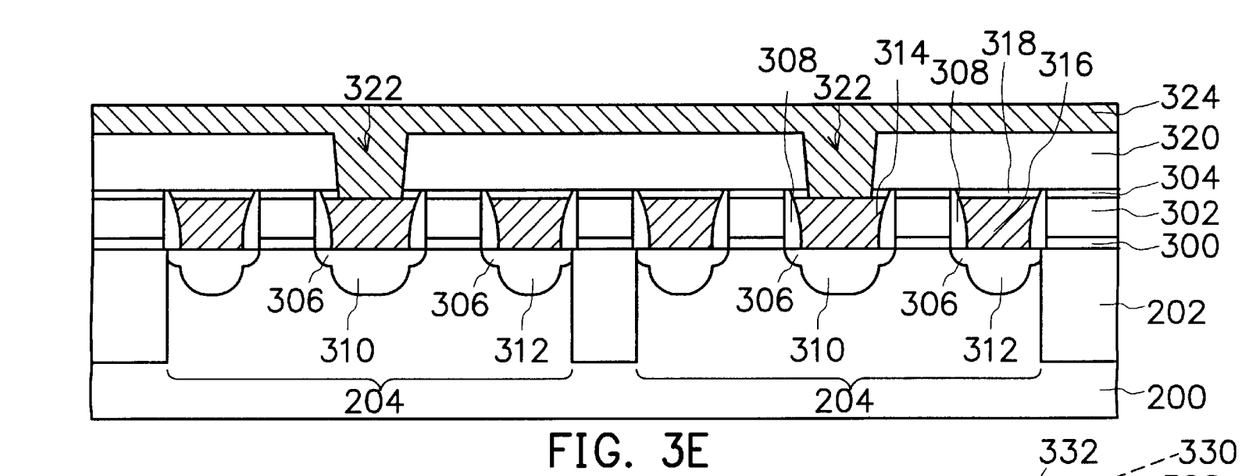

As shown in FIG. 3E, a bit line structure 324 is formed over the first dielectric layer 320. The bit line structure 324 fills the first contact openings 322 so that the bit line 324 and the bit line plugs 322 are electrically connected. The bit line structure 324 can be formed by, for example, depositing polysilicon over the substrate 200 so that all the first contact openings 322 are filled, and performing photolithographic and etching processes to remove a portion of the polysilicon.

Figure 3F:
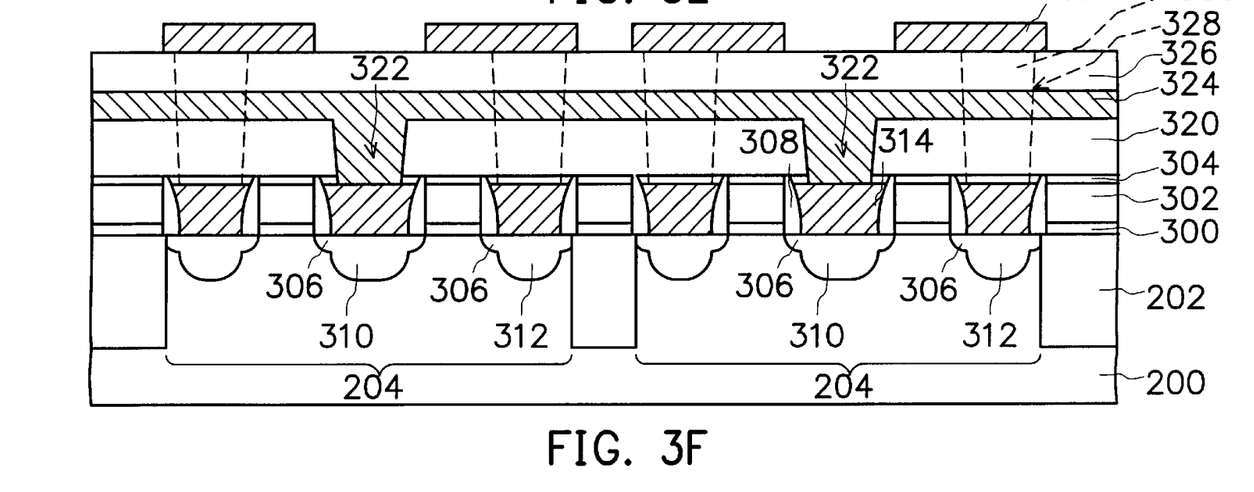

As shown in FIG. 3F, a second dielectric layer 326 that covers the entire substrate 200 is formed. The second dielectric layer 326 can be an oxide layer, for example. A group of second contact openings 328 is formed in the second dielectric layer 326 and the first dielectric layer 320 by etching. The second contact openings 328 expose a portion of the landing pads 316. In the etching step, a portion of the original oxide layer 318 on the landing pads 316 is also removed. Node contacts 330 are formed inside the second contact openings 328 so that the node contacts 330 and the landing pads 316 are electrically connected. Finally, capacitors 332 are formed over the second dielectric layer 326 such that the capacitors 322 and the node contacts 330 are electrically connected. Since the node contacts 330 and the bit line structure 324 are formed on separate cross-sectional planes, the node contacts 330 are marked by dashed lines in FIG. 3F.

Figure 4A:
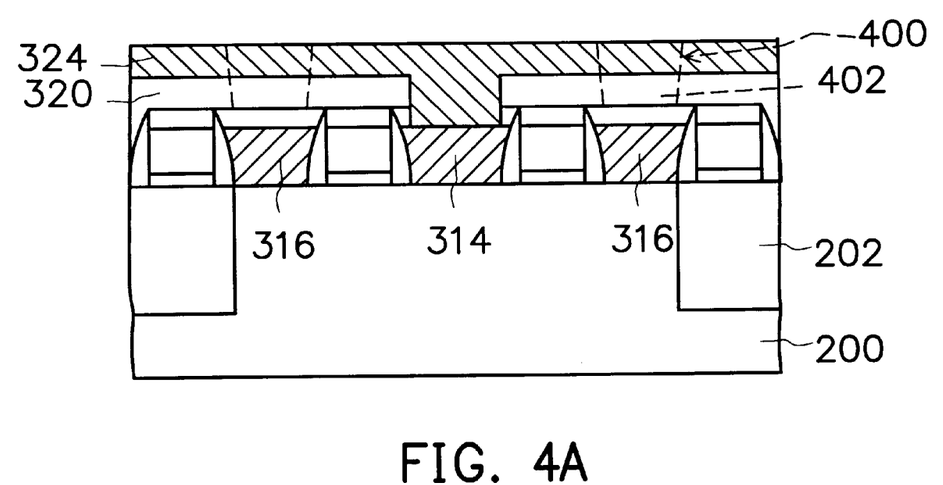
FIGS. 4A and 4B are cross-sectional views along line III—III of FIG. 2 showing the progression of steps for producing a DRAM structure according to a second preferred embodiment of this invention.
Figure 4B:
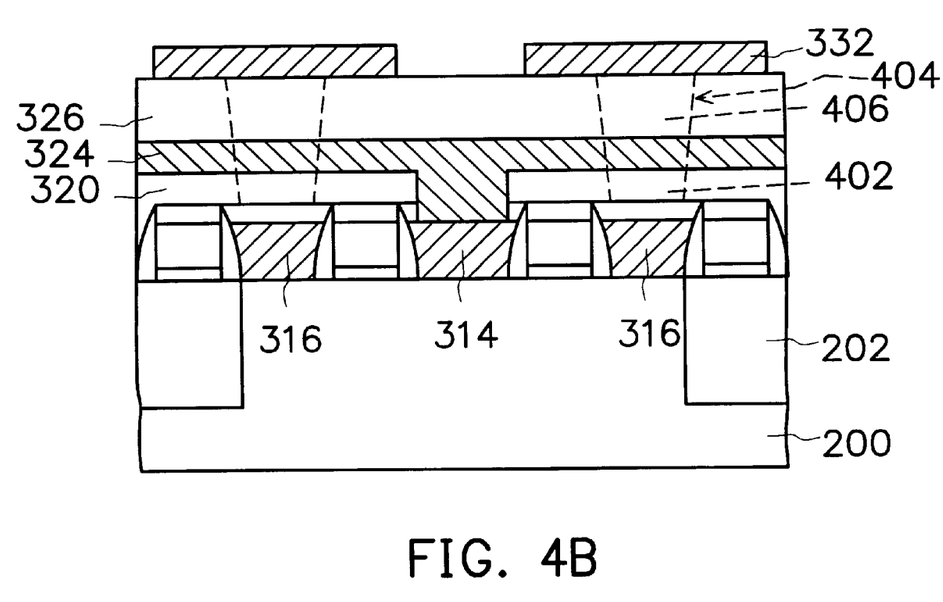

FIGS. 4A and 4B are cross-sectional views along line III—III of FIG. 2 showing the progression of steps for producing a DRAM structure according to a second preferred embodiment of this invention. Since the second embodiment is similar to the first embodiment just described, identical components are labeled with the same set of numbers.

After the first dielectric layer 320 is formed using the method described in the first embodiment, first contact openings 322 and landing pad openings 400 are formed in the first dielectric layer 320 as shown in FIG. 4A. Each first contact opening 322 exposes a portion of the bit line plug 324 while each landing pad opening 400 exposes a portion of the landing pad 326. A bit line structure 324 is formed over the first dielectric layer 320, and second landing pads 402 are formed inside the landing pad openings 400. The bit line structure 324 is electrically connected to the bit line plugs 324 via the first contacts 322. The second landing pads 402 are electrically connected to the respective landing pads 316. Since the second landing pads 402 and the bit line structure 324 are formed on separate cross-sectional planes, the second landing pad openings 400 are marked by dashed lines in FIG. 4A.

As shown in FIG. 4B, a second dielectric layer 326 is formed over the substrate 200. A group of second contact openings 404 is formed in the second dielectric layer 326. The second contact openings 404 expose a portion of the second landing pads 402. Node contacts 406 are formed inside each second contact opening 404 so that the node contacts 406 and the second landing pads 402 are electrically connected. Finally, capacitors 332 are formed over the second dielectric layer 326 such that the capacitors 322 and the node contacts 406 are electrically connected. Since the node contacts 406 and the bit line structure 324 are formed on separate cross-sectional planes, the second contact openings 404 are marked by dashed lines in FIG. 4B.

In the aforementioned method, since the word line structure inside the active region is patterned out in the same process of forming the bit line contact openings and node contact openings, multiple photolithographic and etching processes are avoided. Hence, problems due to the misalignment of bit line contacts and node contacts can be reduced and manufacturing precision can be greatly increased.

Furthermore, the bit line contact openings and node contact openings enclose an area larger than the respective source terminals and drain terminals inside the active region. Therefore, the bit line plugs and landing pads can have a surface area larger than the respective source and drain terminals. A larger bit line plug and landing pad surface area facilitate the alignment of the first and second contact openings with respect to the plugs and the landing pads. In addition, through forming the bit line plugs and the landing pads before the bit line structure and the node contact, aspect ratios of the first and second contact openings are greatly reduced. Thus, overall quality of the bit line structure and node contact is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing dynamic random access memory (DRAM), comprising the steps of:

forming a shallow trench isolation (STI) structure in a substrate such that a plurality of active regions is patterned out, wherein each active region occupies an area having a definite width and length;

sequentially forming a gate oxide layer, a conductive layer and a barrier layer over the substrate;

removing a portion of the barrier layer and the conductive layer so that a plurality of bit line contact openings and a plurality of node contact openings are formed above the substrate, wherein a length of each bit line contact opening is greater than the width of each active region and a length of each node contact opening is greater than the width of each active region, each node contact opening covers a portion of the STI structure outside the active region, the bit line contact openings and the node contact openings pattern out a plurality of word line structures over a portion of the active region and a portion of the STI structure just outside the active region, and a plurality of junction areas connects neighboring word line structures;

forming a plurality of spacers on the sidewalls of bit line contact openings and the node contact openings;

removing a portion of the gate oxide layer at a bottom of each bit line contact openings and each node contact openings not covered by the spacers so that a portion of the substrate is exposed;

forming a source terminal in the substrate exposed at the bottom of each bit line contact opening and forming a drain terminal in the exposed substrate at the bottom of each node contact opening;

forming a bit line plug inside each bit line contact opening;

forming a landing pad inside each node contact opening;

forming an oxide layer over the bit line plugs and the landing pads;

performing word line patterning by removing the junction areas between neighboring word line structures;

forming a first dielectric layer over the substrate;

forming a plurality of first contact openings in the first dielectric layer and removing a portion of the oxide layer to expose the bit line plugs;

forming a bit line structure above the first dielectric layer such that the bit line structure fills the first contact opening and connects the bit line plugs electrically;

forming a second dielectric over the substrate;

forming a plurality of second contact openings in the first and the second dielectric layer and removing a portion of the oxide layer to expose the landing pads, wherein the second contact openings have no direct connection with the bit line structures;

forming a plurality of node contacts inside the second contact openings so that the node contacts and the landing pads are connected electrically; and forming a plurality of capacitors above the second dielectric layer such that each capacitor is electrically connected to a node contact.

2. The method of claim 1, wherein the step of performing word line patterning includes removing the conductive layer and the barrier layer between neighboring word line structures so that each word line structure is separated from neighboring word line structures.

3. The method of claim 2, wherein the step of performing word line patterning includes photolithographic and etching processes.

4. The method of claim 1, wherein before the steps of forming the spacers, further includes implanting to form a lightly doped drain structure in each of the substrate regions exposed by each bit line contact opening and each node contact openings.

5. The method of claim 1, wherein the step of forming the barrier layer includes depositing nitride material.

6. The method of claim 1, wherein the step of forming the bit line plugs and the landing pads includes the substeps of:

depositing polysilicon to fill the bit line contact openings and the node contact openings and to cover the substrate; and chemical-mechanical polishing the polysilicon layer until the polysilicon layer and the barrier layer have a same height.

7. The method of claim 6, wherein the step of forming the oxide layer over the bit line plugs and the node contacts includes performing an oxidation.

8. The method of claim 1, wherein the step of forming the bit line structure further includes the substeps of:

depositing polysilicon to fill the first contact openings and cover the substrate; and removing the polysilicon layer above the first dielectric layer.

9. The method of claim 1, wherein the step of forming the first dielectric layer includes depositing oxide material.

10. The method of claim 1, wherein the step of forming the second dielectric layer includes depositing oxide material.

11. A method for forming a word line in fabrication of dynamic random access memory (DRAM), comprising the steps of:

forming a shallow trench isolation (STI) structure in a substrate such that a plurality of active regions are patterned out, wherein each active region occupies an area having a definite width and length;

sequentially forming a gate oxide layer, a conductive layer and a barrier layer over the substrate;

removing a portion of the barrier layer and the conductive layer so that a plurality of bit line contact openings and a plurality of node contact openings are formed above the substrate, wherein a length of the bit line contact openings is greater than the width of the active regions and a length of the node contact openings is greater than the width of the active regions, each node contact opening covers a portion of the STI structure outside the active region, the bit line contact openings and the node contact openings pattern out a plurality of word line structures over a portion of the active region and a portion of the STI structure just outside the active region, and a plurality of junction areas connects neighboring word line structures;

forming a plurality of spacers on sidewalls of the bit line contact openings and the node contact openings;

removing a portion of the gate oxide layer at a bottom of each bit line contact openings and each node contact openings not covered by the spacers so that a portion of the substrate is exposed;

forming a source terminal in the substrate exposed at the bottom of each bit line contact opening and forming a drain terminal in the substrate exposed at the bottom of each node contact opening;

forming a bit line plug inside each bit line contact opening;

forming a landing pad inside each node contact opening;

forming an oxide layer over the bit line plugs and the landing pads; and performing word line patterning by removing the junction areas between neighboring word line structures.

12. The method of claim 11, wherein the step of performing word line patterning includes removing the conductive layer and the barrier layer between neighboring word line structures so that neighboring word line structures are separated.

13. The method of claim 11, wherein the step of performing word line patterning includes photolithographic and etching processes.

14. The method of claim 11, wherein before the steps of forming the spacers, further includes implanting to form a lightly doped drain structure in each substrate region exposed by each bit line contact opening and each node contact openings.

15. The method of claim 11, wherein the step of forming the barrier layer includes depositing nitride material.

16. The method of claim 11, wherein the step of forming the bit line plugs and the landing pads includes the substeps of:
   depositing polysilicon to fill the bit line contact openings and the node contact openings and cover the substrate; and
   chemical-mechanical polishing the polysilicon layer until the polysilicon layer and the barrier layer have a same height.

17. The method of claim 11, wherein the step of forming an oxide layer over the bit line plugs and the node contacts includes performing an oxidation.

18. A method for manufacturing dynamic random access memory (DRAM), comprising the steps of:
   forming a shallow trench isolation (STI) structure in a substrate such that a plurality of active regions is patterned out, wherein each active region occupies an area having a definite width and length;
   sequentially forming a gate oxide layer, a conductive layer and a barrier layer over the substrate;
   removing a portion of the barrier layer and the conductive layer so that a plurality of bit line contact openings and a plurality of node contact openings are formed above the substrate, wherein a length of the bit line contact openings is greater than the width of the active regions and a length of the node contact openings is greater than the width of the active regions, each node contact opening covers a portion of the STI structure outside the active region, the bit line contact openings and the node contact openings pattern out a plurality of word line structures over a portion of the active region and a portion of the STI structure just outside the active region, an a plurality of junction areas connects neighboring word line structures;
   forming a plurality of spacers on sidewalls of the bit line contact openings and the node contact openings;
   removing a portion of the gate oxide layer at a bottom of each bit line contact opening and each node contact opening not covered by the spacers so that a portion of the substrate is exposed;
   forming a source terminal in the substrate exposed at the bottom of each bit line contact opening and forming a drain terminal in the substrate exposed at the bottom of each node contact opening;
   forming a bit line plug inside each bit line contact opening;
   forming a landing pad inside each node contact opening;
   forming an oxide layer over the bit line plugs and the landing pads;
   performing word line patterning by removing the junction areas between neighboring word line structures;
   forming a first dielectric layer over the substrate;
   forming a plurality of first contact openings and a plurality of landing pad contact openings in the first dielectric layer and removing a portion of the oxide layer to expose the bit line plugs and the landing pads;
   forming a bit line structure above the first dielectric layer such that the bit line structure fills the first contact opening and connects the bit line plugs electrically;
   forming a second landing pad inside each landing pad contact opening such that each second landing pad is electrically connected to a landing pad and there is no connection between the second landing pad and the bit line structure;
   forming a second dielectric over the substrate;
   forming a plurality of second contact openings in the first and the second dielectric layer to expose the second landing pads;
   forming a node contact inside each second contact openings such that the note contacts and the second landing pads are electrically connected; and
   forming a plurality of capacitors above the second dielectric layer such that each capacitor is electrically connected to a node contact.

19. The method of claim 18, wherein the step of performing word line patterning includes using photolithographic and etching techniques to remove the conductive layer and the barrier layer between neighboring word line structures so that neighboring word line structures are separated.

* * * * *